(12) United States Patent
Ishibashi et al.

(10) Patent No.: US 7,981,216 B2
(45) Date of Patent: Jul. 19, 2011

(54) VACUUM PROCESSING APPARATUS

(75) Inventors: Keiji Ishibashi, Fuchu (JP); Masahiko Tanaka, Fuchu (JP); Akira Kumagai, Fuchu (JP); Manabu Ikemoto, Fuchu (JP); Katsuhisa Yuda, Tokyo (JP)

(73) Assignees: Canon Anelva Corporation, Tokyo (JP); NEC Corporation, Tokyo (JP)

( * ) Notice: Subject to any disclaimer, the term of this patent is extended or adjusted under 35 U.S.C. 154(b) by 23 days.

(21) Appl. No.: 10/907,023

(22) Filed: Mar. 16, 2005

(65) Prior Publication Data
US 2005/0217576 A1    Oct. 6, 2005

(30) Foreign Application Priority Data

Mar. 17, 2004    (JP) .................... 2004-076168

(51) Int. Cl.
*C23C 16/505*    (2006.01)
(52) U.S. Cl. ............... 118/715; 156/345.33; 156/345.34
(58) Field of Classification Search .................. 118/715; 156/345.33, 345.34
See application file for complete search history.

(56) References Cited

U.S. PATENT DOCUMENTS

| | | | | |
|---|---|---|---|---|
| 6,024,799 | A * | 2/2000 | Chen et al. | 118/715 |
| 6,086,677 | A * | 7/2000 | Umotoy et al. | 118/715 |
| 6,245,396 | B1 * | 6/2001 | Nogami | 427/562 |
| 6,302,964 | B1 * | 10/2001 | Umotoy et al. | 118/715 |
| 6,508,197 | B1 * | 1/2003 | Omstead et al. | 118/715 |
| 6,756,235 | B1 * | 6/2004 | Liu et al. | 438/3 |
| 6,886,491 | B2 * | 5/2005 | Kim et al. | 118/723 E |
| 6,892,669 | B2 | 5/2005 | Xu et al. | |
| 7,270,713 | B2 * | 9/2007 | Blonigan et al. | 118/715 |
| 2001/0027026 | A1 * | 10/2001 | Dhindsa et al. | 438/712 |
| 2001/0042799 | A1 | 11/2001 | Kim et al. | |
| 2001/0054382 | A1 | 12/2001 | Ko | |
| 2002/0092618 | A1 * | 7/2002 | Collins | 156/345.48 |
| 2002/0152960 | A1 * | 10/2002 | Tanaka et al. | 118/723 R |
| 2003/0054099 | A1 * | 3/2003 | Jurgensen et al. | 427/248.1 |
| 2007/0272154 | A1 | 11/2007 | Amikura et al. | |

FOREIGN PATENT DOCUMENTS

| | | |
|---|---|---|
| EP | 1 008 674 | 6/2000 |
| JP | 2000-345349 | 12/2000 |
| JP | 2003-273094 | 9/2003 |
| JP | 2005-129712 | 5/2005 |

* cited by examiner

*Primary Examiner* — Ram N Kackar
*Assistant Examiner* — Satish Chandra
(74) *Attorney, Agent, or Firm* — Buchanan Ingersoll & Rooney PC (57) ABSTRACT

A vacuum processing apparatus, including a reactor and a partitioning plate having a plurality of through-holes through which radicals are allowed to pass and separating the reactor into a plasma generating space and a substrate process space, the process, such as a film deposition process, being carried out on a substrate placed in the substrate process space by delivering a gas into the plasma generating space for generating a plasma, producing radicals with the plasma thus generated, and delivering the radicals through the plurality of through-holes on the partitioning plate into the substrate process space. The partitioning plate includes a partitioning body having a plurality of through-holes and a control plate disposed on the plasma generating space side of the partitioning body and having radical passage holes in the positions corresponding to the plurality of through-holes on the partitioning plate.

2 Claims, 5 Drawing Sheets

VACUUM PROCESSING APPARATUS

BACKGROUND OF THE INVENTION

1. Field of the Invention

The present invention relates to a vacuum processing apparatus that includes a reactor in which plasma is generated and an electrically neutral excited active species (which will be referred hereinafter to as "radicals") may then be produced from such plasma, and the processes such as, for example, the process of depositing a thin film on a substrate placed in the reactor, the process of finishing the surface of the thin film thus deposited, and the like may be performed on the substrate using those radicals.

2. Related Art

The vacuum processing apparatus in which the radicals are produced by generating plasma within the reactor, and the processes such as, for example, the process of depositing a thin film on the substrate placed in the reactor, the process of finishing the surface of the thin film thus deposited on the substrate in order to improve its film quality, and the like are performed using the radicals may be used in a variety of applications.

For example, a plasma enhanced CVD is used as a vacuum processing apparatus in which an appropriate silicon oxide film may be deposited at a low temperature as a gate insulating film in the production of a liquid crystal display using low temperature polysilicon type TFT.

As disclosed in our prior Japanese patent application now published under No. 2000-345349, a CVD apparatus is proposed as the vacuum processing apparatus in which radicals may be produced by generating plasma within the reactor, and the process such as the film deposition process may be performed on a substrate placed in the reactor (in this specification, the CVD apparatus disclosed in the above patent application is referred to as "RS-CVD apparatus" that stands for the Radical-Shower CVD apparatus, in order to distinguish this CVD apparatus from the usual plasma enhanced CVD apparatus.

In the RS-CVD apparatus described in Japanese Patent publication No. 2000-345349, it is proposed that radicals may be produced by generating plasma within the reactor, and the film deposition process may be performed on the substrate using the produced radicals and a film deposition gas.

Specifically, in the RS-CVD apparatus described in the patent publication No. 2000-345349, it is proposed that the apparatus may be used in the following manner.

Initially, the reactor may be internally divided into a plasma generating space and a film deposition process space (which is functionally equivalent to the substrate process space) that are separated from each other by means of a partitioning plate having a plurality of through-holes through which the radicals are allowed to pass, a gas is delivered into the plasma generating space for producing radicals which may then be delivered through the plurality of holes on the partition plate into the film deposition process space. Then, in the film deposition process space, the film deposition gas delivered directly into this space as well as the radicals delivered through the plurality of through-holes on the partitioning plate into the space react with each other, and the film deposition process is performed on the substrate (for example, a glass substrate having the size of 370 mm.times.470 mm) placed in the film deposition process space.

In the specification, the phrase "the film deposition gas delivered directly" into the substrate process space, that is, the film deposition process space should be understood to refer to the film deposition gas that may be delivered directly into the substrate process space, that is, the film deposition process space from outside the reactor, without contacting the plasma or radicals.

Figure 1:
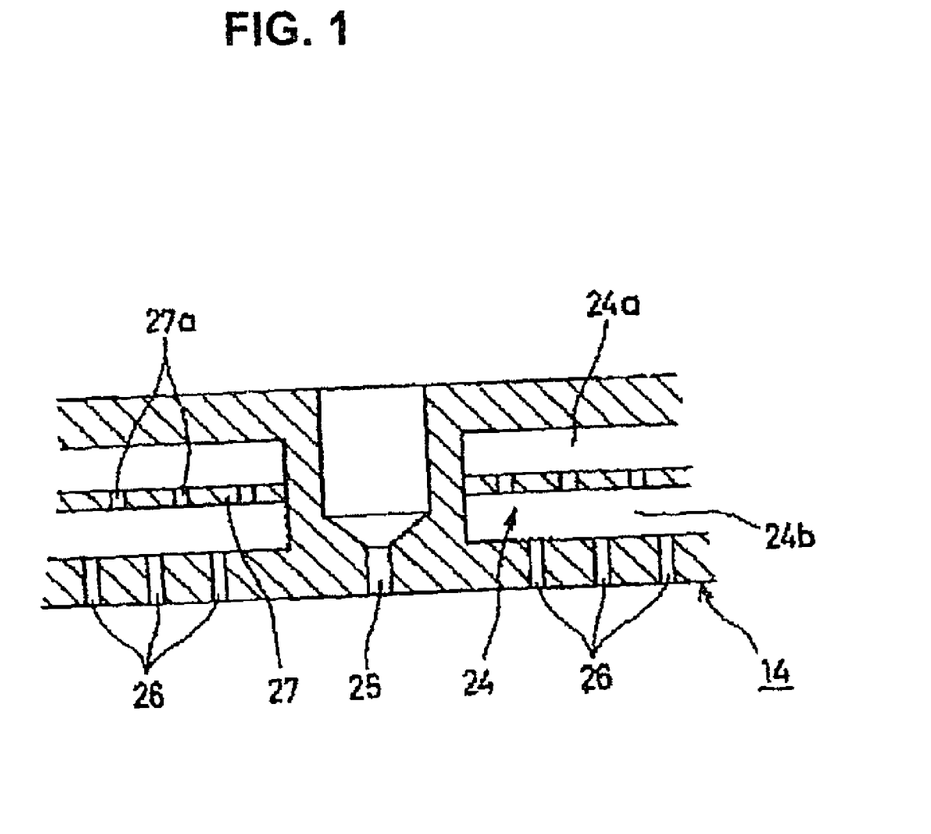
FIG. 1 is a cross sectional view of one embodiment of a conventional partitioning plate which can be employed in the RS-CVD apparatus for internally dividing the reactor into the plasma generating space and the substrate process space.

FIG. 1 represents the general construction of the conventional partitioning plate employed in the RS-CVD apparatus when it is used for depositing a thin film on the substrate as proposed in the patent publication No. 2000-345349.

The partitioning plate 14 contains a plurality of film deposition gas diffusion spaces 24a and 24b. Those film deposition gas diffusion spaces 24a and 24b communicate with each other, and are isolated from the plasma generating space above them. The film deposition gas diffusion spaces 24a and 24b also communicate with the film deposition process space below them through the film deposition gas diffusion holes 26 as shown in FIG. 1. The film deposition gas is delivered into those film deposition gas diffusion spaces 24a and 24b through a film deposition gas inlet connected to a film deposition gas delivery pipe, is diffused through the film deposition gas diffusion spaces 24a and 24b, and is supplied uniformly into the total area of the film deposition process space through the film deposition gas diffusion holes 26.

The partitioning plate 14 further has a plurality of through-holes 25 that pass through the locations where the film deposition gas diffusing spaces 24a and 24b are not provided from one side toward the other side (in the vertical direction in FIG. 1).

As the reactor is internally divided into the plasma generating space and the film deposition process space that are separated from each other by means of the partitioning plate 14 constructed as described above, the radicals that have been generated in the plasma generating space may only be delivered into the film deposition process space through the through-holes 25, while the film deposition gas that has been delivered into the film deposition gas diffusion space 24a and 24b from outside the reactor may be delivered directly into the film deposition process space through the film deposition gas diffusion holes 26, without contacting the plasma or radicals until.

The vacuum processing apparatus, such as the RS-CVD apparatus as proposed in the patent application 2000-345349 for depositing a thin film on a substrate, wherein the reactor is internally divided into the plasma generating space and the substrate process space that are separated from each other by means of the partitioning plate having the plurality of holes through which the radicals are allowed to pass, the radicals may be produced using the plasma generated by delivering the gas into the plasma generating space, those radicals may be delivered into the substrate process space through the plurality of holes on the partitioning plate, and the process such as the film deposition process may be performed on the substrate placed in the substrate process space, remains yet to be improved as described below.

For the conventional partitioning plate employed in such vacuum processing apparatus as shown in FIG. 1, the surface of the partitioning plate 14 located on the plasma generating space may be hit by the plasma discharge, causing the surface to be deteriorated. If such surface deterioration should occur, the partitioning plate 14, which contains the plurality of film deposition gas diffusion spaces 24, would have to be replaced as a whole.

When the plasma discharge conditions are to be modified to meet the particular processing requirements for a substrate placed in the substrate process space and if such plasma discharge conditions are then to be modified by changing the sizes of the individual radicals passage holes 25, the partitioning plate 14 would also have to be replaced as a whole.

Having to replace the partitioning plate as a whole only because the surface of the partitioning plate on the plasma generating space side has been deteriorated as described above would lead to the increased running costs for the vacuum process apparatus.

It may be appreciated from FIG. 1 that the partitioning plate 14 that is employed in the RS-CVD apparatus described above takes the form such that it contains the plurality of film deposition gas diffusion spaces 24 that are separated from the plasma generating space and leading to the film deposition process space in order to permit the film deposition gas to be delivered directly into the film deposition process space from outside the reactor. More specifically, the partitioning plate 14 includes a plurality of plates stacked one over another, and there may be a gap between any two adjacent plates through which the radicals may enter the film deposition gas diffuse space 24, causing the radicals to react with the film deposition gas by contacting the same inside the partitioning plate 14.

SUMMARY

One object of the present invention is to solve the problems associated with the conventional vacuum processing apparatus as described above, in which the reactor is internally divided into the plasma generating space and the substrate process space that are separated from each other by means of the partitioning plate having the plurality of holes through which radicals are allowed to pass, an appropriate gas is delivered into the plasma generating space where plasma may be generated for producing radicals, and the radicals thus produced are delivered into the substrate process space through the plurality of through-holes on the partitioning plate where the process such as the film deposition process may be carried out on the substrate placed in the substrate process space.

In order to solve the above problems, the present invention proposes to provide a vacuum processing apparatus, wherein the reactor is internally divided into the plasma generating space and the substrate process space that are separated from each other by means of a plate, such as a partitioning plate, having the plurality of holes through which radicals are allowed to pass, an appropriate gas is delivered into the plasma generating space where plasma may be generated for producing radicals, and the radicals thus produced are delivered into the substrate process space through the plurality of holes on said plate, such as the partitioning plate, where the process such as the film deposition process may be carried out on the substrate placed in the substrate process space, and wherein said plate, such as the partitioning plate, is comprised as described herein.

In the vacuum processing apparatus of the present invention, the before described plate, such as the partitioning plate, includes a partitioning body having a plurality of through-holes and a control plate disposed on the plasma generating space side of the partitioning body. Said control plate has a radical passage hole in the position corresponding to each of the plurality of through-holes on the partitioning body.

The processes that the vacuum processing apparatus of the present invention may perform on a substrate placed in the substrate process space include the process of depositing a thin film on the substrate, the process of finishing the surface of the thin film thus deposited on the substrate, thereby improving the film quality of the substrate, and the like.

In accordance with an embodiment of the present invention, the process of depositing the thin film on the substrate placed in the substrate process space, for example, may be performed by causing the radicals that have been delivered into the substrate process space (which corresponds to the film deposition process space for the RS-CVD apparatus) through the plurality of through-holes on the partitioning plate and the film deposition gas that has been delivered directly into the substrate process space to react each other, as is the case with the RS-CVD apparatus described earlier.

In the vacuum processing apparatus of the embodiment of the present invention described above, the control plate that forms the partitioning plate together with the partitioning body may further include a projection having a radical passage hole that is provided in the position corresponding to each of the through-holes on the partitioning body.

In the forms of the plate, such as the partitioning plate, described above, said plate includes the partitioning body having the plurality of through-holes and the control plate disposed on the side of the plasma generating space. Thus, in the event that the surface of the control plate located on the side of the plasma generating space should be hit by the plasma discharge, causing the surface to be deteriorated, only the control plate would have to be replaced, but not the entire partitioning plate.

Thus, if the vacuum processing apparatus of the present invention is to be implemented as the RS-CVD apparatus described above, it would be possible to reduce the running costs that have been incurred for the conventional RS-CVD apparatus, and if the plasma discharge conditions are to be modified by changing the sizes of the individual radical passage holes, only the control plate would also have to be replaced, not the partitioning plate as a whole.

In the RS-CVD apparatus, this eliminates the need of replacing the partitioning body that is connected to the film deposition gas delivery pipe through which the film deposition gas is delivered from the outside. Thus, the amount of radicals passing through the holes comprising radical passage holes provided on the control plate and through-holes provided on the partitioning body. And the flow rate of oxygen gas to be delivered into the plasma generating space can be adjusted and changed easily, respectively, in order to meet the particular processing conditions and requirements for a substrate. This can provide the wider processing margins and optimized process conditions.

When the partitioning plate of the latter form described above (that is, the partitioning plate of the form that includes the control plate having the projection having the radical passage hole and provided in the position corresponding to each of the through-holes on the partitioning body) is employed, the projection having the radical passage hole on the control plate may be inserted into the corresponding through-holes on the partitioning body from the plasma generating space side. This can prevent the radicals from entering the film deposition diffusion space through the gap between the control plate and partition plate. Thus, there is no risk of causing the radicals to react with the film deposition gas inside the partitioning plate. The above may similarly apply where the partitioning body contains the plurality of film deposition gas diffusion spaces and the partitioning plate includes the partitioning body and the control plate disposed on the plasma generating space side of the partitioning body.

It should be noted that when the projection that may be provided on the control plate takes the form that permits it to be inserted tightly into the corresponding through-hole provided on the partitioning body, such as, for example, when the through-hole on the partitioning body has the cylindrical shape, the projection on the control plate should desirably be formed like a cylindrical shape having its external diameter corresponding to the internal diameter of the above cylindrical through-hole. In this way, the apparatus can provide the action and effect effectively.

In the vacuum processing apparatus embodiment of the present invention described above, the partitioning body and the control plate that is located on the plasma generating space side of the partitioning body may be fastened together, for example, by having the respective peripheral edges of the partitioning body and control plate tightened by means of screws and the like.

In accordance with an embodiment of the vacuum processing apparatus of the present invention, the reactor is internally divided into the plasma generating space and the substrate process space that are separated from each other by means of the partitioning plate, wherein the partitioning plate is formed by the partitioning body having the plurality of through-holes and the control plate located on the plasma generating space side of the partitioning body.

Thus, in the event that the surface of the control plate located on the side of the plasma generating space should be hit by the plasma discharge, causing the surface to be deteriorated, only the control plate would have to be replaced, not the whole partitioning plate.

Similarly, when the discharge conditions are to be modified by changing the sizes of the individual radical passage holes, there would be no need of replacing the partitioning body that is connected to the delivery pipe for delivering film deposition gas from the outside. In this case, only the control plate would also have to be replaced.

It may be appreciated from the above description that in the embodiment of the vacuum processing apparatus of the present invention wherein the reactor is internally divided into the plasma generating space and the substrate process space that are separated from each other by means of the partitioning plate having the plurality of radical passage holes provided on the control plate and through-holes provided on the partitioning body through which radicals are allowed to pass, an appropriate gas may be delivered into the plasma generating space where plasma may be generated for producing radicals, and the radicals thus produced may then be delivered into the substrate process space through said radical passage holes and through-holes on the partitioning plate where film may be deposited on the substrate placed in the substrate process space, the running costs for the apparatus can be improved.

In this vacuum processing apparatus, there is no need of replacing the partitioning plate that is connected to the film deposition gas delivery pipe, the amount of radicals to be delivered through the through-holes and the flow rate of oxygen gas to be delivered into the plasma generating space can be adjusted and changed easily, respectively, in order to meet the particular processing contents or requirements for the substrate. This can provide the wider process margins and optimized process conditions.

When the partitioning plate that takes the form that permits the projection having radical passage holes on the control plate to be inserted into the through-holes provided on the partitioning body and located on the side of the plasma generating space is employed in the apparatus, radicals can be prevented from entering the film deposition gas diffusion space through the gaps between the control plate and partitioning plate, causing the radicals and film deposition gas to react each other inside the partitioning plate, even when the partitioning body contains the plurality of film deposition gas diffusing spaces and the partitioning plate is formed by placing the control plate on the side of the plasma generating space.

PREFERRED EMBODIMENTS OF THE INVENTION

Several preferred embodiments of the vacuum processing apparatus according to the present invention are now described by referring to the accompanying drawings, in which the apparatus is implemented as RS-CVD apparatus and the process, such as the process of depositing a thin film on a substrate placed in the substrate process space, may be performed on such RS-CVD apparatus.

Figure 5:
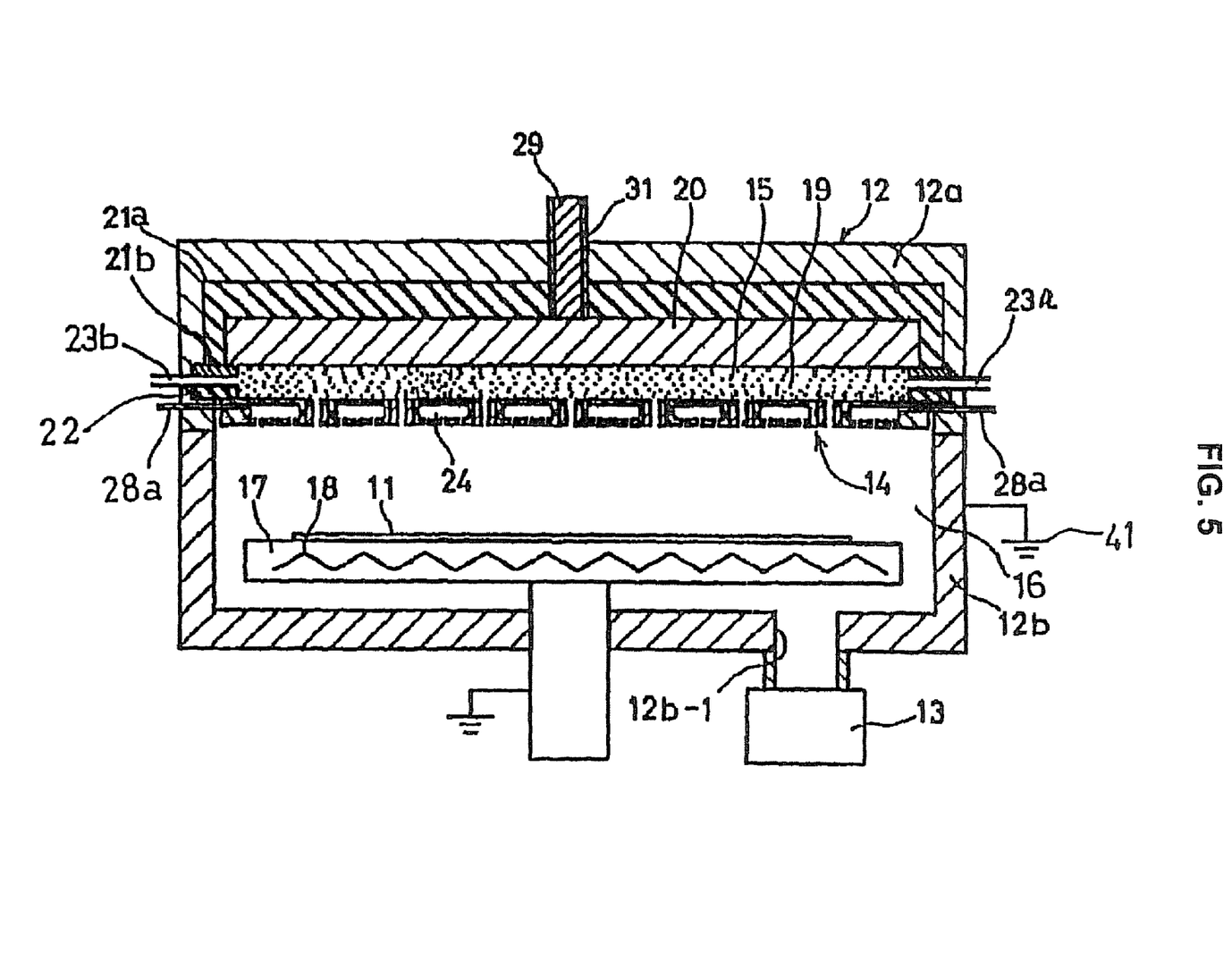
FIG. 5 is a cross sectional view of one example of the vacuum processing apparatus according to the present invention, wherein the apparatus is implemented as RC-CVD apparatus.

Referring to FIG. 5, a first preferred embodiment of the vacuum processing apparatus of the present invention that is implemented as RS-CVD apparatus is described below.

On this vacuum processing apparatus, preferably silane is used as a film deposition gas, and a silicon oxide film may be deposited on an upper surface of a glass substrate 11 as a gate insulating film for general TFT purposes.

The reactor 12 of the vacuum processing apparatus is maintained in the predetermined vacuum state by the pumping mechanism 13 when film deposition is being carried out. The pumping mechanism 13 is connected to the pumping port 12b-1 provided in the reactor 12.

The reactor 12 includes a partitioning plate 14 made of an electrically conductive material and placed in its horizontal position. The partitioning plate 14 has a round shape in plane, and is disposed with its peripheral edges pressed against the lower side of a ring-shaped electrically conductive fastening part 22 so that it can be kept in a hermetical state.

Thus, the reactor 12 is internally divided into an upper room and a lower room that are separated from each other by means of the partitioning plate 14, the upper room forming a plasma generating space 15 and the lower room forming a film deposition process space 16 that corresponds to the substrate process space.

The partitioning plate 14 has a particular thickness as desired, and is generally formed like a flat plate. Furthermore, the partitioning plate 14 has the plane form that is analogous to the horizontal cross sectional form of the reactor 12. There is a plurality of film deposition gas diffusion spaces 24 inside the partitioning plate 14.

A glass substrate 11 is disposed on a substrate support mechanism 17 that is provided in the film deposition process space 16. The glass substrate 11 is disposed in such a way that it is essentially parallel with the partitioning plate 14, with the surface (upper side) on which the film is to be deposited facing the bottom surface of the partitioning plate 14.

The substrate support mechanism 17 is maintained at the same potential as the reactor 12, and is maintained at ground potential 41. A heater 18 is provided within the substrate support mechanism 17. The temperature of the glass substrate 11 may be maintained at a fixed temperature by means of this heater 18.

The construction of the reactor 12 is now described in more detail. From the viewpoint of the ease of assembly, the reactor 12 is constructed from an upper container 12a that forms the plasma generating space 15 and a lower container 12b that forms the film deposition process space 16. When assembling the upper container 12a and the lower container 12b to form the reactor 12, the partitioning plate 14 is disposed between the upper and lower containers 12a and 12b.

The partitioning plate 14 is mounted such that the upper side of the peripheral edge of the electrically conductive fastening part 22 having its lower side pressing against the peripheral edge of the partitioning plate 14 can make contact with the lower one 21b of the two ring-shaped insulating parts 21a, 21b that is to be interposed between the upper container 12a and an electrode 20 when the electrode 20 is mounted as described later. The plasma generating space 15 and the film deposition process space 16 may thus be formed on the upper and lower sides of the partitioning plate 14 so that they can be separated from each other.

FIG. 5 represents the first embodiment of the vacuum processing apparatus according to the present invention wherein the apparatus is implemented as RS-CVD apparatus. In this vacuum processing apparatus (RS-CVD apparatus), the region of the plasma generating space 15 in which plasma 19 may be generated is defined by the partitioning plate 14, the upper container 12a and the plate-shaped electrode (RF electrode) 20 located centrally between the partitioning plate 14 and upper container 12a. The electrode 20 has a plurality of holes 20a formed thereon, and is supported and secured by the two ring-shaped insulating parts 21a, 21b located on the inner lateral side of the upper container 12a.

A delivery pipe 23a for delivering gas, such as oxygen gas, from the outside into the plasma generating space 15 is provided in the ring-shaped insulating part 21a. As shown, a delivery pipe 23b for delivering a cleaning gas, such as fluoride gas and the like, may also be provided. Those delivery pipes are connected to the oxygen gas source (not shown) and cleaning gas source (not shown), respectively, via the mass flow controller (not shown) that controls the mass flow rate.

An electrical power conductor rod 29, which is connected to the electrode 20, is provided in the ceiling of the upper container 12a. RF power for the discharging purpose may be supplied to the electrode 20 by means of the electrical power conductor rod 29. The electrode 20 may function as an RF electrode. The electrical power conductor rod 29 is covered with insulating materials 31 so that it can be electrically isolated from the other metal parts.

The partitioning plate 14 is placed at ground potential 41 via the electrically conductive part 22.

The reactor is internally divided into the plasma generating space 15 and the film deposition process space 16 that are separated from each other by means of the partitioning plate 14, and the partitioning plate 14 has a plurality of through-holes 25 that are formed so that they can go through the partitioning plate 14 on the side thereof where the film deposition gas diffusion space 24 is not present. The plasma generating space 15 and the film deposition process space 16 only communicate with each other through those through-holes 25.

The film deposition gas diffusion space 24 is the space where the film deposition gas delivered from the outside into the partitioning plate 14 may be diffused uniformly, and then may be supplied to the film deposition process space 16. The film deposition gas diffusion space 24 communicates with the film deposition process space 16 through the plurality of film deposition gas diffusion holes 26.

A delivery pipe 28a for delivering film deposition gas from the outside is connected to the film deposition gas diffusion space 24 through the film deposition gas inlet 28b. This delivery pipe 28a is disposed so that it can be connected to the film deposition gas inlet 28b from the lateral side.

The film deposition gas that has been delivered into the film deposition gas diffusion space 24 of the partitioning plate 14 through the film deposition gas delivery pipe 28a and then through the film deposition gas inlet 28b may be diffused within the film deposition gas diffusion space 24, and then may be supplied to the film deposition process space 16 directly through the film deposition gas diffusion holes 26, without contacting the radicals or plasma.

As the reactor is constructed as described above, the film deposition gas can be supplied so that it may be distributed uniformly over the total area of the film deposition process space 16. Thus, the thickness-uniformity and quality of the film being deposited can be improved.

In the preceding description, it should be noted that the size and construction that may be applied to the through-holes 25 and film deposition gas diffusion holes 26 satisfy the condition of $uL/D > 1$ as specified in the patent application JP 2000-345349 mentioned earlier. When this condition is satisfied for the through-holes 25, for example, the film deposition gas delivered into the film deposition process space 16 can be prevented from flowing back into the plasma generating space 15 where the film deposition gas would be diffused.

In the above condition expression, u is the flow rate of gas through the through-holes 25 and film deposition gas diffusion holes 26, that is, the gas that is delivered into the plasma generating space 15 for producing plasma that contributes to depositing a thin film on the substrate. More specifically, u represents the flow rate of oxygen gas through the through-holes 25 or the flow rate of the film deposition gas that is delivered into the film deposition gas diffusion space 24 where it is diffused, and is then delivered into the film deposition process space 16 through the film deposition gas diffusion holes 26. L represents the effective length of the through-hole 25 and film deposition gas diffusion hole 26, respectively. For the through-hole 25 shown in FIG. 2, for example, it represents the length of the narrow portion of the radical passage hole 25. Finally, D represents the mutual gas diffusion factor for two kinds of gases. Specifically, it represents the mutual gas diffusion factor for the film deposition gas such as silane gas, for one, and the principal gas such as oxygen gas, for the other, which is delivered into the plasma generating space 15 where it produces radicals and contributes to depositing a thin film on the substrate.

FIG. 8 represents a second embodiment of the vacuum processing apparatus according to the present invention wherein the apparatus is implemented as RS-CVD apparatus. The structural features of the second embodiment shown in FIG. 8 are that the insulating part 21a is provided inside the ceiling of the upper container 12a and the electrode 20 is disposed below the insulating part 21a. The electrode 20 has no such hole 20a as for the electrode 20 in the preceding embodiment shown in FIG. 7, and has a single-plate form. The plasma generating space 15 of parallel flat plate is formed by the electrode 20 and partitioning plate 14. The remaining parts of the construction are essentially the same as those of the first embodiment shown in FIG. 7. In FIG. 8, each of the elements that are essentially similar to those described in FIG. 7 is given a similar reference numeral, and the detailed description of those elements is omitted in order to avoid the duplication of the description.

Figure 4A:
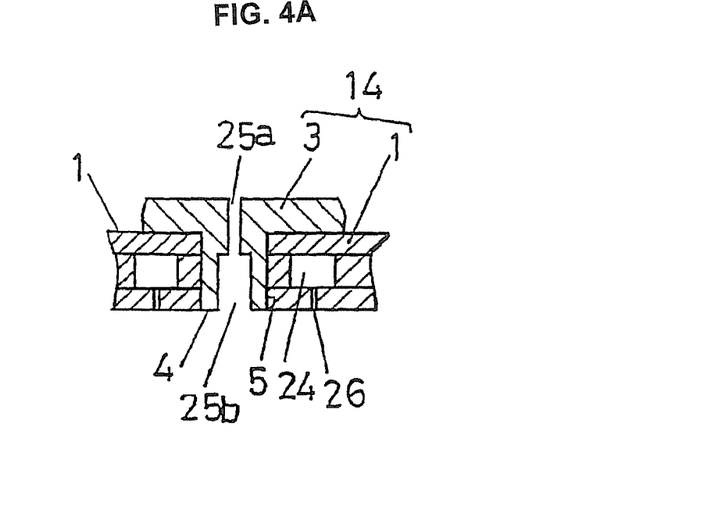
FIG. 4(a) is a partly cross sectional view of another embodiment of the partitioning plate employed in the vacuum process apparatus according to the present invention, wherein the through-hole is shown in an enlarged scale.
Figure 4B:
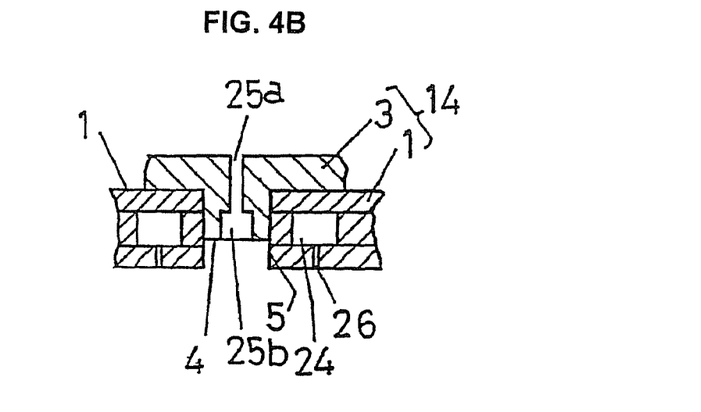
FIG. 4(b) is a partly cross sectional view of the partitioning plate shown in FIG. 4(a), wherein the through-hole of another form is shown in an enlarged scale.
Figure 4C:
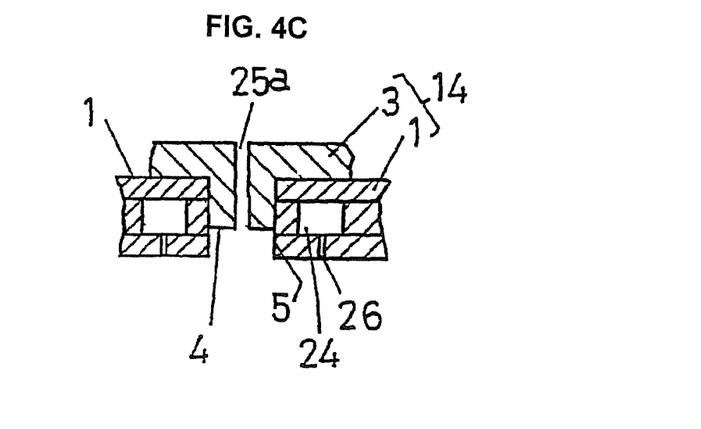
FIG. 4(c) is a partly cross sectional view of the partitioning plate shown in FIG. 4(a), wherein the through-hole of still another form is shown in an enlarged scale.

FIG. 4 is a cross sectional view of the partitioning plate 14 for the vacuum processing apparatus of the present invention that is implemented as RS-CVD apparatus as described so far, although some parts or elements are not shown, wherein this RS-CVD apparatus may be used to perform the process on the substrate placed in the substrate process space, such as the process of depositing a thin film on the substrate.

The reactor 12 is internally divided into the plasma generating space 15 and the film deposition process space 16 that are separated from each other by means of the partitioning plate 14.

Figure 2:
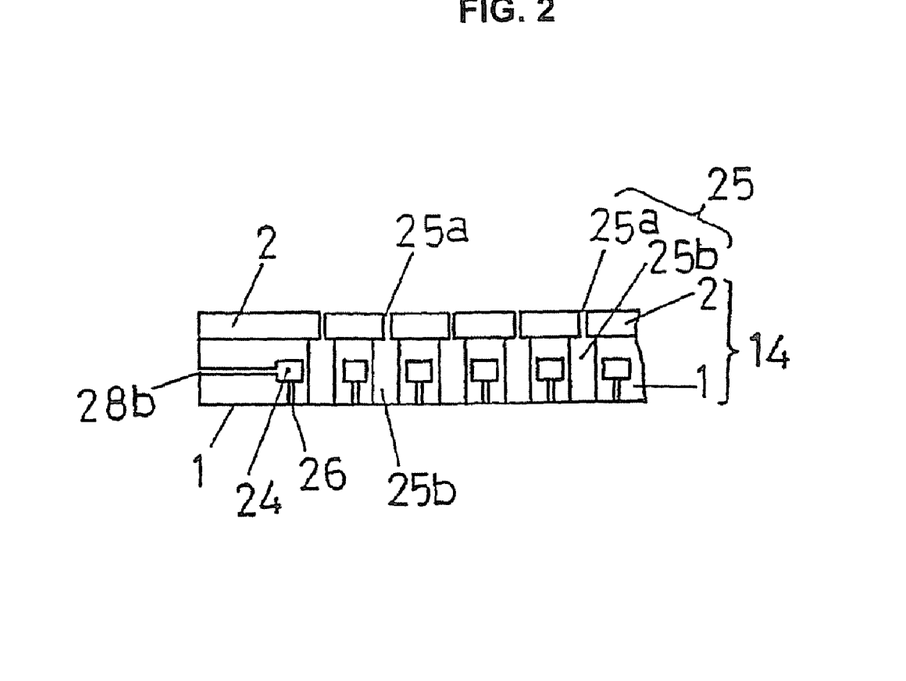
FIG. 2 is a partly cross sectional view of one embodiment of the partitioning plate employed in the vacuum processing apparatus according to the present invention, wherein the reactor is internally divided into the plasma generating space and the substrate process space that are separated from each other by means of the partitioning plate.
Figure 3:
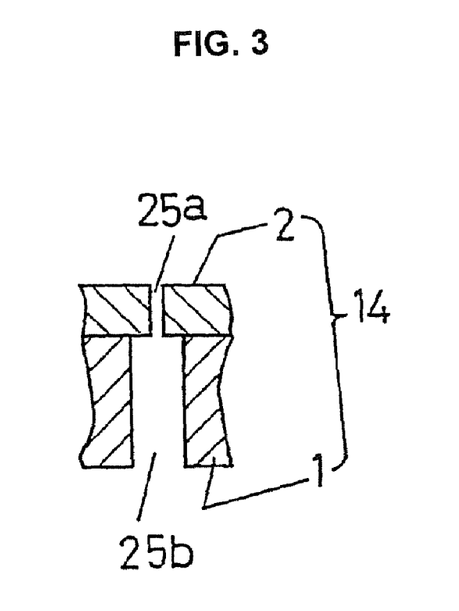
FIG. 3 is a cross sectional view showing a through-hole on an enlarged scale in FIG. 2.

FIG. 5 is a cross sectional view of the through-hole 25 that is shown on an enlarged scale. In FIGS. 4 and 5, each of those structural parts or elements that are similar to those in the vacuum processing apparatus of the present invention described using FIG. 7 and those in the conventional partitioning plate that has been employed in RS-CVD apparatus described using FIGS. 1 through 3 is given a similar reference numeral, and the detailed description of those elements is omitted in order to avoid the duplication of the description.

The partitioning plate 14 is formed such that the control plate 2 may be located on the side (upper side in FIG. 4) of the plasma generating space of the partitioning body 1. When the partitioning plate 14 is formed such that the control plate 2 may be located on the upper side of the partitioning body 1, for example, the partitioning plate 1 and control plate 2 may be located close to each other by having their respective peripheral edges being tightened by means of screws and the like.

The partitioning body 1 contains the film deposition gas diffusion space 24 therein that communicates with the film deposition process space 16 (the lower side in FIG. 4) through the film deposition gas diffusion holes 26. On the region of the partitioning body 1 where the film deposition gas diffusion space 24 is not present, a plurality of through-holes that function as the radical escape holes 25b are provided such that they can pass through the partitioning body 1 from one side toward the other side (in the vertical direction for the embodiment in FIG. 4).

The control plate 2 has radical passage holes 25a, each of which is provided in the position corresponding to each of the through-holes functioning as the radical escape holes 25b on the partitioning body 1.

As shown in FIG. 4, the partitioning plate 14 may be formed so that it includes the partitioning body 1 and control plate 2 that are placed one over the other closely to each other, and the reactor 12 may be internally divided into the plasma generating space 15 and the film deposition process space 16 separated from each other by means of the partitioning plate 14. In this way, the radical passage hole 25a and radical escape hole 25b can communicate with each other, and the through-hole 25 through which the plasma generating space 15 and the film deposition process space 16 communicate with each other in the conventional partitioning plate 14 shown in FIG. 1 can thus be formed.

Specifically, when the vacuum processing apparatus is implemented as RS-CVD apparatus wherein the reactor 12 is internally divided into the plasma generating space 15 and the film deposition process space 16 that are separated from each other by means of the partitioning plate 14 as shown in FIG. 4, radicals that have been generated in the plasma generating space 15 may be delivered into the film deposition process space 16 through the radical passage holes 25a on the control plate 2 and then through the radical escape holes 25b on the partitioning body 1.

Figure 6:
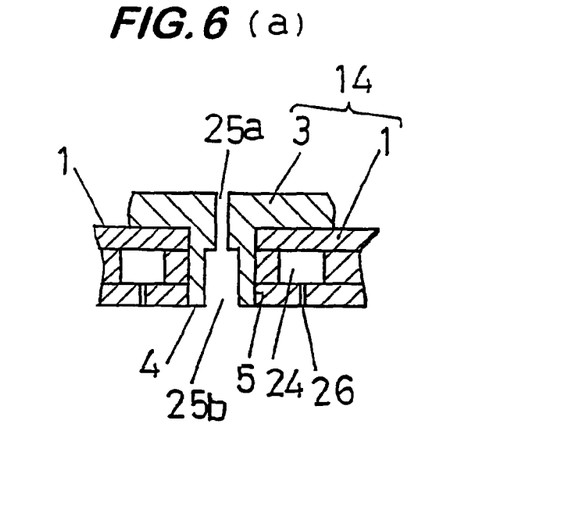
FIG. 6 is a cross sectional view of anther example of the vacuum processing apparatus according to the present invention, wherein the apparatus is implemented as RC-CVD apparatus.

FIGS. 6(a) through (c) are cross sectional views illustrating another form of the partitioning plate 3, in which the reactor 12 is internally divided into the plasma generating space 15 and the film deposition process space 16 that may be separated from each other by means of this partitioning plate 14, although some parts or elements are not shown.

When the partitioning plate 14 takes the form in which it is formed by placing the control plate 3 on the side of the plasma generating space 15 of the partitioning body 1 (the upper side in FIG. 6(a)), it is the same as for the partitioning plate 14 shown in FIGS. 4 and 5 and described above.

The partitioning plate 14 shown in FIGS. 6(a) through (c) is also the same as for the partitioning plate 14 shown in FIGS. 4 and 5 and described earlier in that the partitioning body 1 contains the film deposition gas diffusion space 24 therein that communicates with the film deposition process space 16 (the lower side in FIG. 4) through the film deposition gas diffusion holes 26 and in that the plurality of through-holes 5 are provided on the region of the partitioning body 1 where the film deposition gas diffusion space 24 is not provided so that they can pass through that region from one side toward the other side (in the vertical direction in the embodiment shown in FIGS. 6(a) through (c)).

In the partitioning plate 14 shown in FIG. 6(a), the control plate 3 has a projection 4 in the position corresponding to each of the through-holes 5 on the partitioning body 1 so that it may be inserted into the corresponding through-hole 5. The projection 4 has both of the radical passage hole 25a and radical escape hole 25b.

The partitioning plate 14 shown in FIG. 6(a) may be formed by placing the partitioning body 1 and control plate 3 one over the other closely to each other, with their respective peripheral edges being tightened by means of screws (not shown), and then by inserting the projection 4 on the control plate 3 into the corresponding through-hole 5 on the partitioning body 1.

The height (length) of the projection 4 provided on the control plate 3 may be as large as the height (depth) of the corresponding through-hole 5 on the partitioning body 1 as shown in FIG. 6(a), or may be smaller (shorter) than the height (depth) of the corresponding through-hole 5 on the partitioning body 1 as shown in FIG. 6(b).

In the partitioning plate 14 of the form shown in FIG. 6(c), the projection 4 on the control plate 3 only has the radical passage hole 25a, and the through-hole 5 on the partitioning body 1 may act as the radical escape hole 25b.

The control plates 2, 3 may be formed from SUS or aluminum as for the partitioning body 1. In the event that the surface of the control plates 2, 3 located on the side of the plasma generating space should be hit by the plasma discharge, causing the surface to be deteriorated, or when the size of the radical passage hole 25a is to be modified to meet the particular discharging requirements, such control plates 2, 3 may be replaced by new control plates which are optimum.

Now, one example of the process of depositing a thin film (silicon oxide film) using the vacuum processing apparatus of the present invention (which is implemented as RS-CVD apparatus) having the construction described so far is described below.

A glass substrate 11 is transported by a transfer robot (not shown) into the reactor 12, in which the glass substrate 11 is placed in position on the substrate support mechanism 17. Then, the reactor 12 is pumped out by means of the pumping mechanism 13, and the pressure is reduced and maintained at the predetermined vacuum state.

Next, oxygen gas is delivered through the delivery pipe 23a into the plasma generating space 15 of the reactor 12.

In the meantime, film deposition gas such as silane, for example, is delivered into the film deposition gas diffusion space 24 of the partitioning plate 14 through the film deposition gas delivery pipe 28a and then through the film deposition gas inlet 28b. Silane is diffused in the film deposition gas diffusion space 24, and is then delivered into the film deposition process space 16 directly through the film deposition gas diffusion holes 26, that is, without contacting radicals or plasma until they are in the film deposition process space 16.

The substrate support mechanism 17 in the film deposition process space 16 is previously maintained at the predetermined temperature by means of the heater 18 that is made to conduct electrically by the electrical power.

In the above state, RF power is supplied to the electrode 20 by way of the electrical power conductor rod 29. A discharge is produced by the RF power, and an oxygen plasma 19 is generated around the electrode 20 in the plasma generating space 15. The production of the oxygen plasma 19 results in the formation of radicals that are neutral active species (excited active species).

When the partitioning plate of the form shown in FIG. 4 or FIG. 6(a) is employed, the radicals thus formed may be delivered through the radical passage holes 25a and then through the radical escape holes 25b into the film deposition process space 16).

When the partitioning plate of the form shown in FIG. 6(b) is employed, the radicals may be delivered through the radical passage holes 25a, radical escape holes 25b and then through the through-holes 5 into the film deposition process space 16.

When the partitioning plate of the form shown in FIG. 6(c) is employed, the radicals may be delivered through the radical passage holes 25a and then through the through-holes 5 into the film deposition process space 16.

In the meantime, the film deposition gas such as silane may be delivered into the film deposition gas diffusion space 24 in the partitioning plate 14, from which it may then be delivered through the film deposition gas diffusion holes 26 into the film deposition process space 16.

Then, the chemical reaction may be caused by permitting the radicals and silane to contact each other inside the film deposition process space 16. Thus, the silicon oxide film may be deposited on the surface of the glass substrate 11 and a thin film may thus be formed thereon.

The preferred embodiment of the vacuum processing apparatus of the present invention wherein the apparatus is implemented as RS-CVD apparatus and the process, such as the process of depositing the thin film on the substrate placed in the substrate process space, may be performed on such RS-CVD apparatus has been described. It may be appreciated from the foregoing description that this embodiment is only presented as one example, and the vacuum processing apparatus of the present invention may be implemented in other forms. For example, the oxygen radicals that have been generated in the plasma generating space 15 may be delivered through the radical passage holes 25a and then through the radical escape holes 25b into the substrate process space 16 that is functionally equivalent to the substrate process space where the oxidation process can occur on the thin film of the substrate placed in the film deposition process space 16.

Although only preferred embodiments have been illustrated and described specifically so far, it may be appreciated that many modifications and variations of the present invention are possible in light of the above teachings and without departing from the spirit and intended scope of the invention.

What is claimed is:

1. A vacuum processing apparatus for processing a substrate using a film deposition process, comprising:
    a reactor chamber; and
    a plate having a plurality of through holes configured and positioned to allow passage therethrough and separating the reactor chamber into a plasma generating space where a plasma generating electrode is provided and a substrate process space where a substrate is to be disposed;
    wherein the film deposition process comprises carrying out on a substrate placed in the substrate process space by delivering a plasma generating gas into the plasma generating space for generating a plasma, producing radicals with the plasma thus generated, and delivering the radicals through the plurality of through-holes in said plate into the substrate process space,
    wherein said plate comprises:
    a partitioning body having the plurality of through-holes and a gas diffusion space formed inside the body and communicating with the substrate process space through diffusion holes to diffuse a feeded film deposition gas and flow the diffused film deposition gas into the substrate process space through the diffusion holes but being closed to the plasma generating space so that the feeded film deposition gas to be introduced into the substrate process space does not contact with the radicals until the feeded film deposition gas enters the substrate process space, and
    a control plate detachably attached to the partitioning body and positioned on the plasma generating space side of the partitioning body;
    wherein the control plate has radical passage holes in alignment with the plurality of through-holes in the partitioning body, and a diameter of the radical passage holes is smaller than that of a diameter of the through-holes so that the amount of the radicals introduced into the substrate process space is determined by the diameter of radical passage holes in the control plate;
    wherein the control plate includes a plurality of projections at each of which projections, one of the radical passage holes is formed, wherein each of the projections fits into a respective through-hole so as to define the respective radical passage hole;
    wherein the radical passage holes have a stepped diameter such that a diameter of the radical passage holes is smaller nearer the plasma generating space than at the substrate process space.

2. The vacuum processing apparatus as defined in claim 1, wherein the partitioning body includes a lower plate and an upper plate for defining the gas diffusion spaces therebetween, and the control plate is attached to the upper plate.

* * * * *